United States Patent [19]

Burnett

[11] 4,071,780

[45] Jan. 31, 1978

[54] TRANSIENT GENERATOR

[75] Inventor: Ronald H. Burnett, Wheeling, Ill.

[73] Assignee: Corcom, Inc., Chicago, Ill.

[21] Appl. No.: 722,282

[22] Filed: Sept. 10, 1976

[51] Int. Cl.² ............... H03K 5/15; H03K 5/01; H03K 3/35
[52] U.S. Cl. ............... 307/262; 307/246; 307/252 J; 307/294; 307/311; 307/268; 331/1 A; 331/18
[58] Field of Search ............... 331/1 A, 18, 25; 307/262, 271, 246, 311, 252 J, 294, 268

[56] References Cited

U.S. PATENT DOCUMENTS

| 3,130,376 | 4/1964 | Ross ............................ 331/1 A |
| 3,418,497 | 12/1968 | Sauter et al. ............... 307/262 |
| 3,493,884 | 2/1970 | Kulp ........................... 307/262 X |
| 3,500,214 | 3/1970 | Broadhead et al. ....... 307/262 X |
| 3,549,906 | 12/1970 | Hellstrom et al. ........ 307/262 X |
| 3,660,666 | 5/1972 | Hendrickson .............. 307/252 J |
| 3,801,837 | 4/1974 | Pease et al. ................ 307/311 |

Primary Examiner—John S. Heyman
Attorney, Agent, or Firm—Howard H. Rogers, Jr.

[57] ABSTRACT

A transient generator for testing the susceptibility of, particularly, digital equipment to noise and the efficacy of filter designs in removing it. The device is adapted for capacitative coupling to the equipment and employs digital circuitry for the control of the output transient.

19 Claims, 11 Drawing Figures

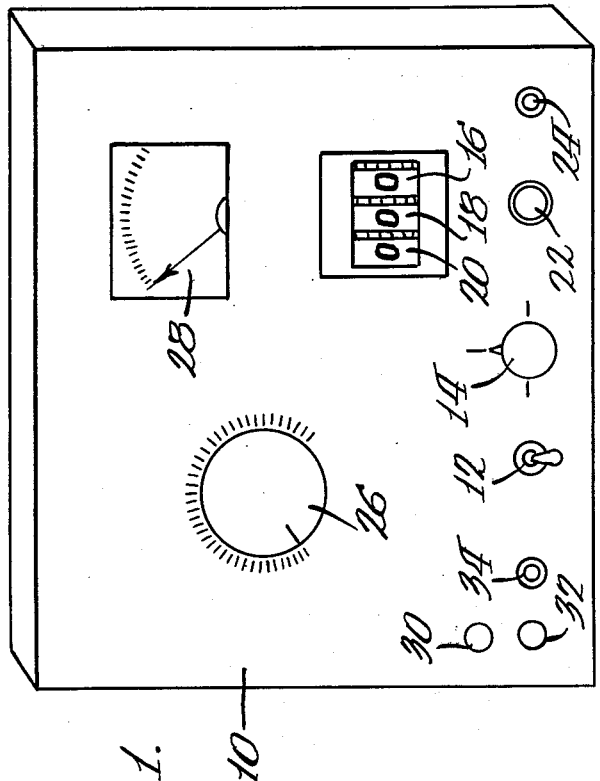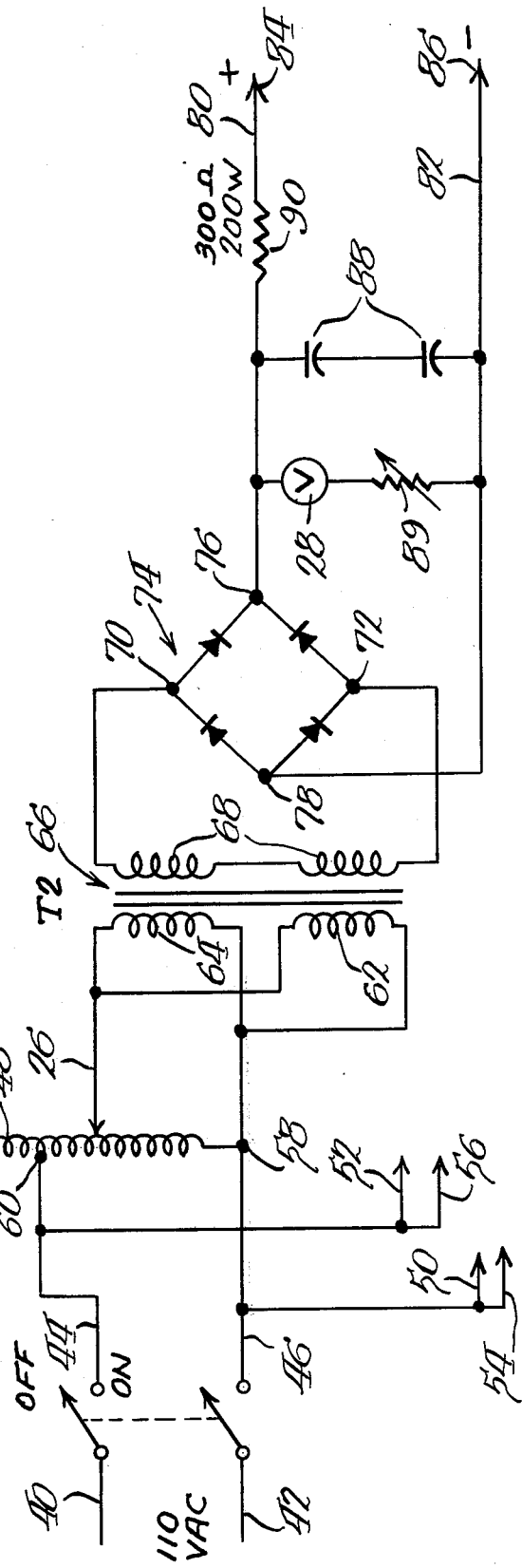

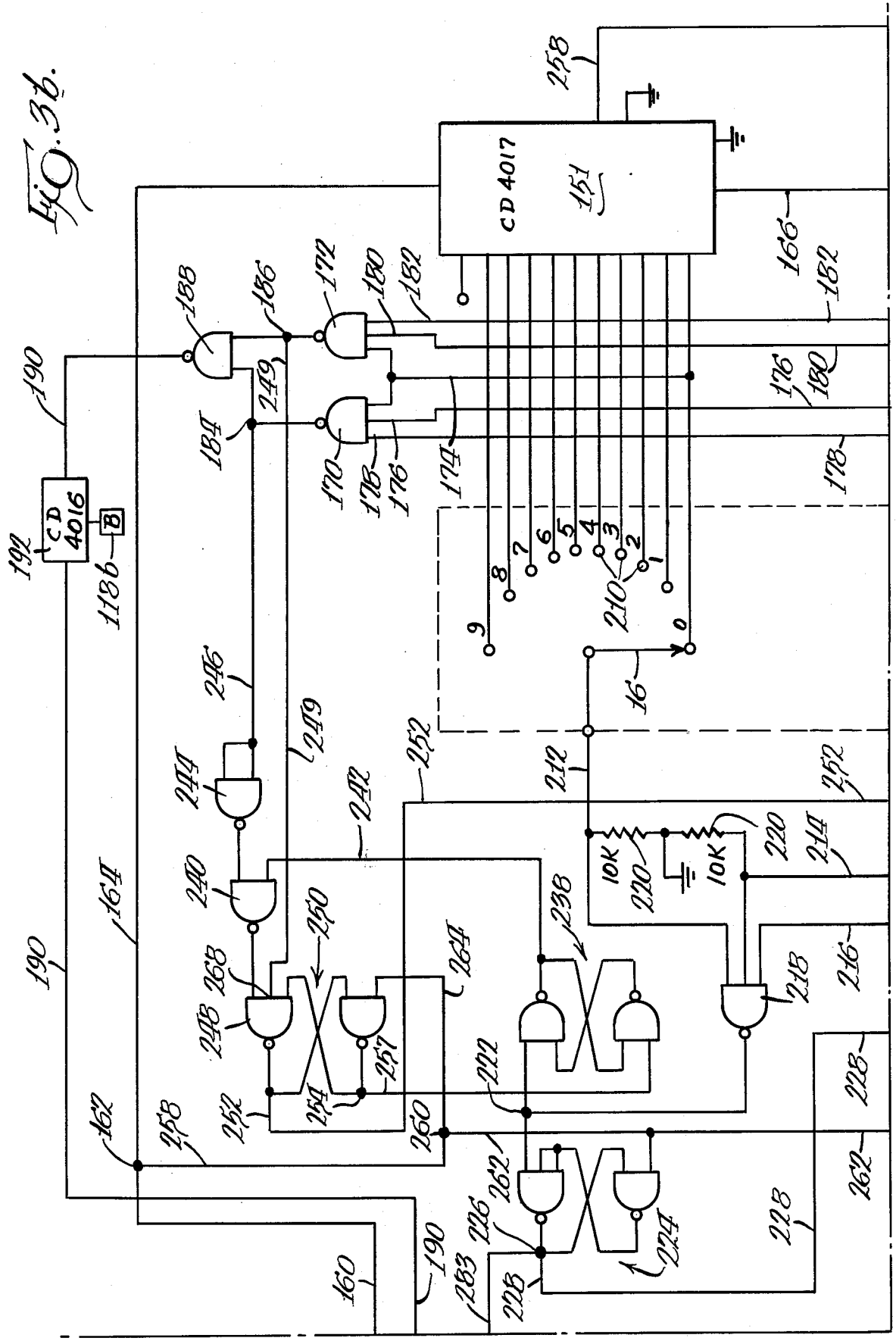

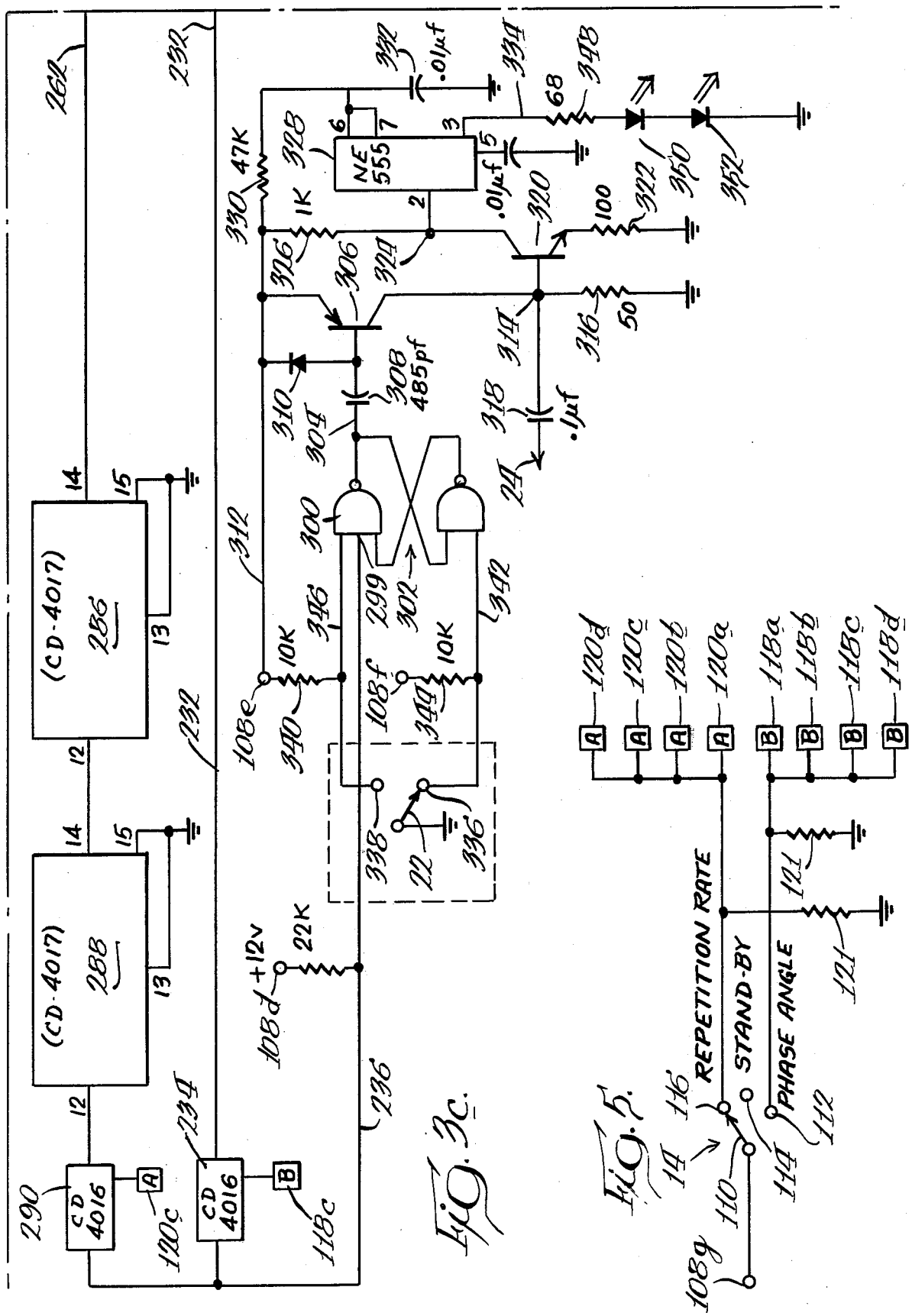

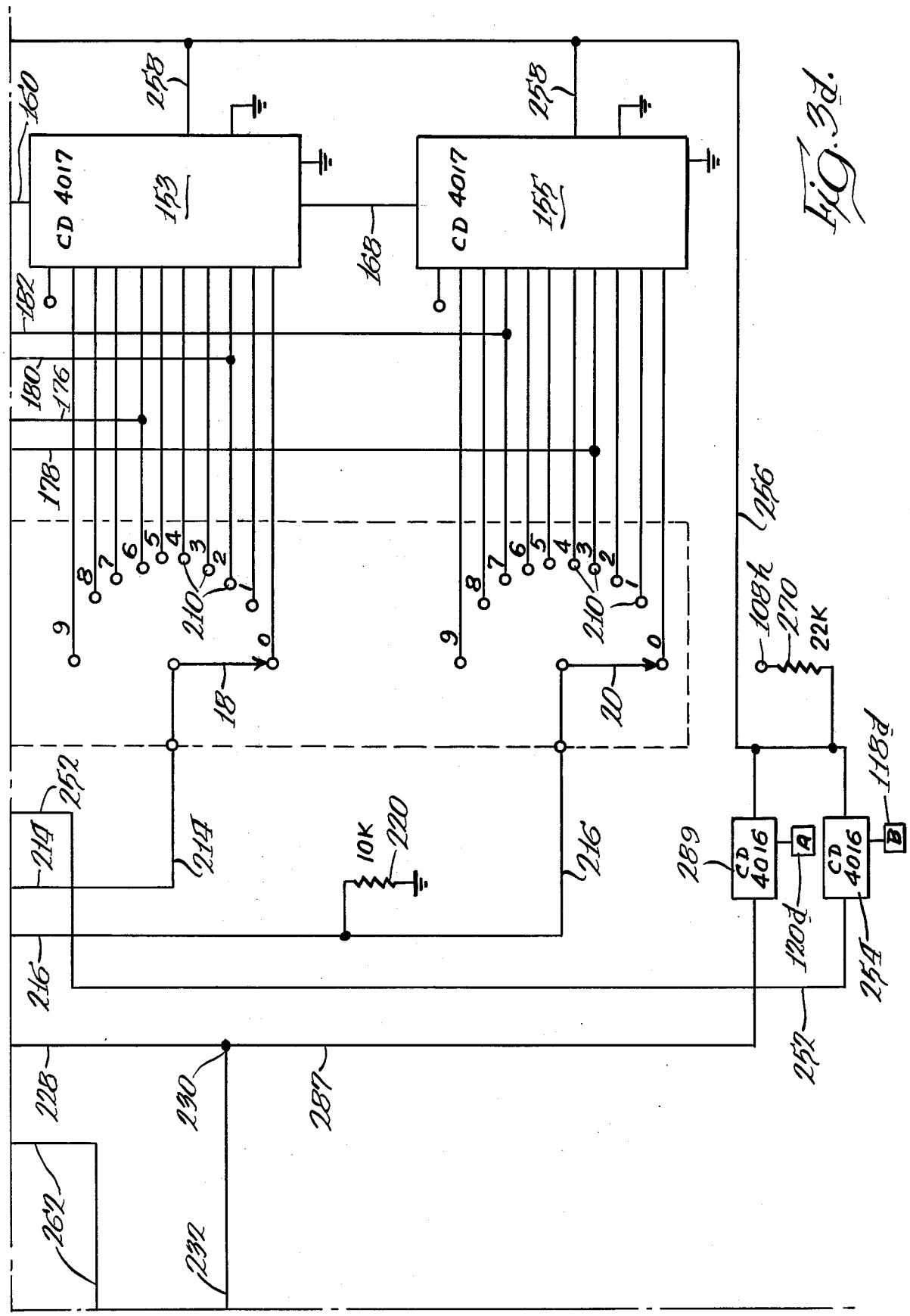

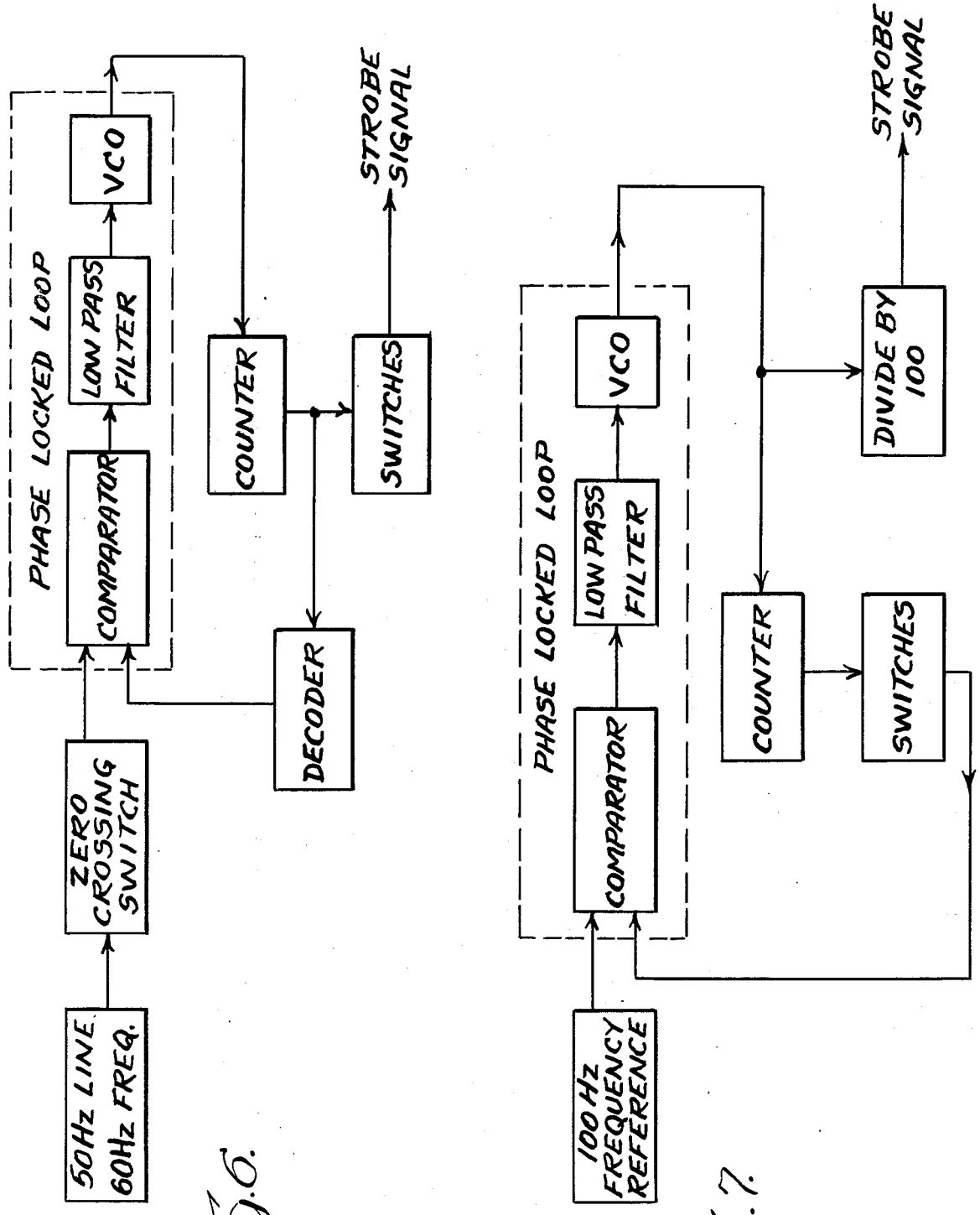

TRANSIENT GENERATOR

BACKGROUND OF THE INVENTION

Digital equipment is highly susceptible to noise in the power source. As a consequence, filters are normally interposed in the power line, and it is of concern to the filter manufacturers or equipment manufacturers that the effectiveness of their filters be ascertained. The device of the present invention serves to inject a transient or noise into such a circuit to determine the efficacy of the filter.

It is desirable that testing procedures achieve as nearly as possible the practical conditions arising in the field use of digital equipment. To this end, the output impedance of the generator should be close to what the power line impedance would be. While power line impedances are not particularly consistent as between various areas, their impedance is generally low.

A transient generator should generate a transient having a broad continuous band of frequencies running from 100 Hz upwardly of 100 MHz to be certain that the filtering system accommodates any frequency within that spectrum.

As far as is known, pulse generators have invariably been transformer-coupled to the equipment undergoing tests. A capacitor is charged by a large impedance power supply. An SCR is connected across the capacitor to effect its discharge, and the primary of a step-up coupling transformer is connected to receive the pulse of the discharging capacitor, the secondary of which is connected either in series or parallel to the equipment undergoing tests and amplifies the voltage to a maximum output of, for instance, 600 v.

The transformer coupling has two undesirable effects. First, the pulse rise time is relatively slow which results in a diminished spectrum of noise at the high frequency end, as may be predicted by Fourier analysis. Second, the output impedance of the transient rises sharply with the frequency. For example, a characteristic transformer-coupled pulse generator which shows a 4 ohm output impedance with respect to the 100 Hz component of the transient will show about 500 ohms with respect to the 25 MHz component. Thus simulation of power line conditions at the high frequency end of the transient is defeated.

Transient generators as hitherto known have been generally of the relaxation oscillator type wherein circuit elements in the oscillator are adjusted to obtain the desired periodicity of the transient pulses or the desired phase angle thereof. This requires the use of external instrumentation such as oscilloscopes and frequency counters along with the transient generator in order to establish the frequency or the phase angle.

SUMMARY OF THE INVENTION

The transient generator which forms the subject matter of the present invention meets the objections described above.

First, it is capacitatively coupled to the equipment to be tested and thus is characterized by a low, substantially uniform impedance across the frequency spectrum of the transient. Thus the output can be tailored by an external passive network to match any power line impedance curve.

Furthermore, the capacitive coupling results in a notably shorter rise time of the pulse which, as pointed out above, results in a stronger noise spectrum at the high frequency end.

For example, a commercial transformer-coupled transient generator was compared with the generator here. The pulse was set at 225 v. peak. The rise time of the commercial generator was 1.25 u sec; that of the present generator was 0.6 u sec. The commercial generator showed a continuous spectrum down to 60 db below peak to 10 Mhz when loaded with a 2 ohm resistor. The present generator showed a continuous spectrum to 60 db below peak to 25 MHz, both loaded and unloaded.

Furthermore, the present invention employs a phase-locked-loop keyed either to line frequency or to a clock. By this technique, either the phase angle to the reference line frequency or the repetition rate per unit time can be electronically determined without reference to external instrumentation and adjustment of controls on the generator.

Other objects and advantages of this invention will be apparent from the following description.

DESCRIPTION OF THE DRAWINGS

FIG. 1 is a front elevtion of the cabinet of the present invention;

FIG. 2 is a circuit diagram of the power supply;

FIG. 5 is a diagram of the mode switch circuitry;

FIG. 6 is a block diagram of the control logic circuitry in the PHASE ANGLE mode of operation; and FIG. 7 is a block diagram of the control logic circuitry in the REPETITION RATE mode of operation.

DESCRIPTION OF A PREFERRED EMBODIMENT

1. External Characteristics

Figure 3A:
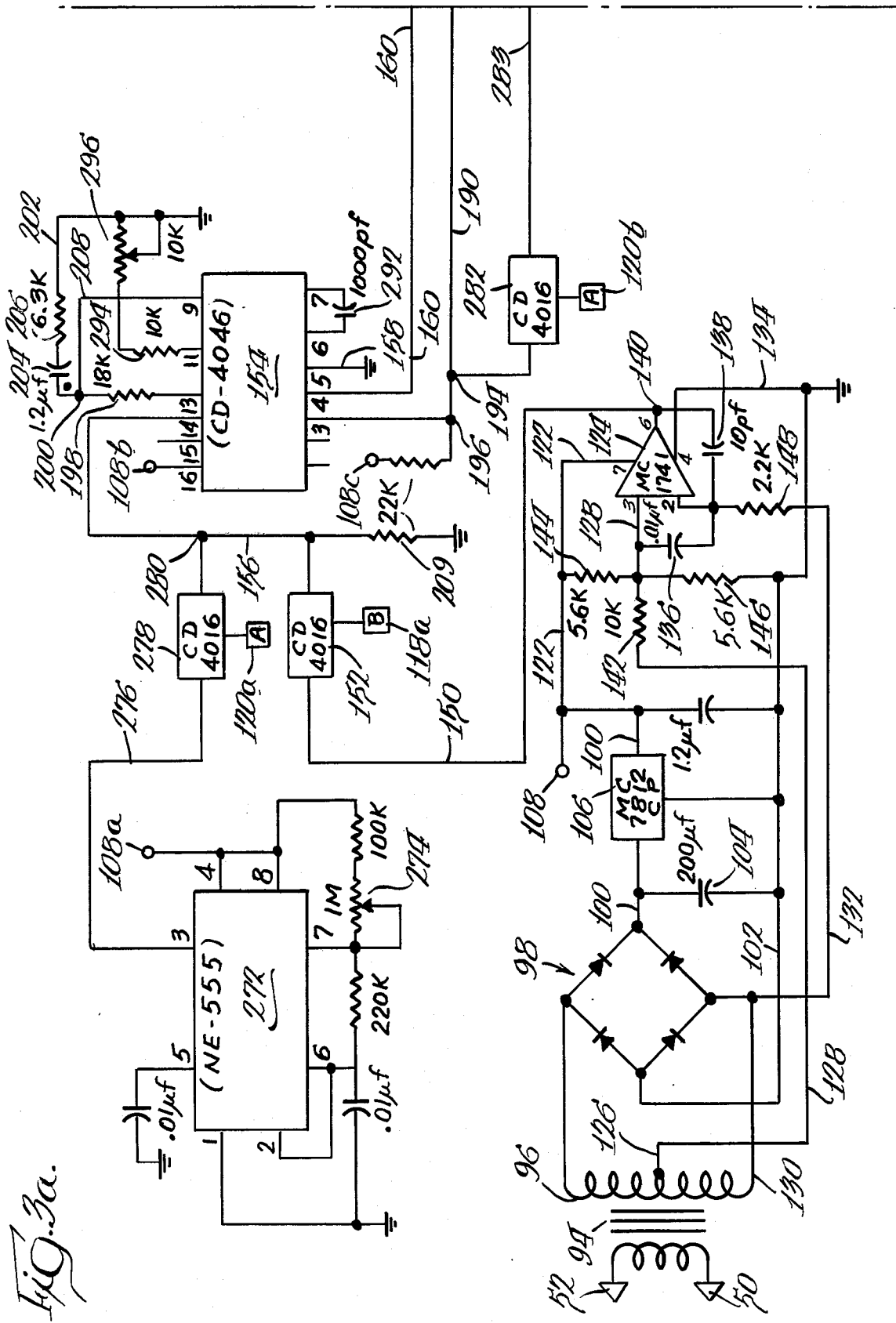
FIG. 3 is a diagram of the control logic circuitry divided, as shown, into FIG. 3a, the upper left, FIG. 3b, the upper right, FIG. 3c, the lower left, and FIG. 3d, the lower right portions of that diagram.

The device of the present invention is enclosed in a cabinet 10 (FIG. 1) and includes a number of external controls, inputs, and outputs whose position within the circuitry will be described in conjunction with the detailed description of the circuits. The controls are being listed here in order to make clear the various functions and capabilities of the apparatus.

The controls include an on-off switch 12. A three-position mode switch 14 is movable to a PHASE ANGLE position whereby the transient is placed at any point on the line voltage input curve, starting from the positive-going zero crossing point, from 0° to 720° by 1 degree increments; to a STAND-BY position where pulses can be manually or externally triggered; or to a REPETITION RATE position wherein transients are generated adjustably from one to one thousand per second. The thumb wheel controls of three decade counter switches 16, 18, and 20 appear on the front panel, switch 16 counting units, switch 18 counting tens, and switch 20 counting hundreds. The decade counter switches determine the phase angle of the transient when the mode switch is in the PHASE ANGLE position and the transients per second when the mode switch is in the REPETITION RATE position.

The single transient switch 22 is a spring loaded momentary switch which generates a single output transient each time the switch is released when the mode switch 14 is in STAND-BY position. When the mode switch is in either of the other positions, the output pulses are inhibited while the switch is pushed in. A jack 24 is provided for a trigger output to auxiliary equipment. In the STAND-BY mode, an external trigger source can be connected to jack 24 to initiate internal transient generation. A rotary, pulse amplitude control 26 adjusts the transient amplitude from 0 to 600 volts, the amplitude being read on a meter 28. A pair of output terminals 30 and 32 are adapted for connection to the apparatus to be tested. A chassis ground jack is provided at 34.

2. Power Supply

Referring now to FIG. 2 illustrating the power supply, a plug-in line cord consisting of conductors 40 and 42 is connected to the cabinet-mounted, on-off, double pole single throw switch 12. The switch 12 closes or opens a circuit through conductors 44 and 46 which are connected to one side of an autotransformer 48. In parallel with the autotransformer, terminals 50 and 52 are provided for energizing the control logic circuit and terminals 54 and 56 for energizing the high voltage circuit, both to be later described.

Line 46 is connected to the common terminal 58 of the transformer 48. Line 44 is connected to a selected tap 60 of the transformer to provide a maximum output of about 150 volts. The sliding tap of the transformer 48 is the pulse amplitude control switch 26 on the front panel of the instrument housing and is continuously adjustable between 0 to 150 volts output.

The common tap 58 and the sliding tap 26 of the autotransformer 48 are connected to two parallel-connected primary windings 62 and 64 of a step-up transformer 66 to provide a 4x voltage multiplication in the secondary 68. The secondary 68 is connected to the input terminals 70 and 72 of a full wave diode bridge rectifier 74. The output terminals 76 and 78 of the bridge 74 are connected through lines 80 and 82 to terminals 84 and 86 respectively which make connection with the high voltage charge path of the high voltage circuit to be later described.

Filter capacitors 88 are connected across the lines 80 and 82 to filter the output of the bridge 74. The voltmeter or peak amplitude meter 28 which appears on the front panel of the housing 10 is also connected across these lines in series with a variable, calibrating resistor 89 to indicate the voltage available for transient formation. A resistor 90 is situated in line 80 to limit current flow.

3. Control Logic Circuit

Referring now to FIG. 3, as stated above, in addition to providing pulses triggered individually or from an external source, the control logic circuit provides for pulses at any phase angle away from the positive-going zero crossing point of line voltage from 0° to 720° in the PHASE ANGLE mode of operation or, alternatively, a fixed whole number of pulses per second from 1 to 1000 in the REPETITION RATE mode.

As its power supply, the control logic circuit has a transformer 94, the primary of which is connected to terminals 50 and 52 of the high voltage power supply circuit of FIG. 2. The secondary 96 of the transformer is connected to a full wave diode bridge rectifier 98 with output leads 100 and 102. The output is filtered by capacitor 104 between the output lines and the filtered output is applied to a fixed voltage, 3-terminal voltage regulator 106 (MC7812CP) to provide, in line 100 +12 volts in the embodiment illustrated with reference to chassis ground line 102. This voltage is developed at terminal 108 and is applied at a number of other points 108a, 108b, 108c, 108d, 108e, 108f, 108g, and 108h which are not shown connected to terminal 108 for purposes of simplicity in the drawings, but in fact are.

In FIG. 5 is shown a diagram of the mode switch 14 which appears on the face of the cabinet 10. The movable contact 110 of the switch 14 is energized to +12 volts by connection to terminal 108g which is powered by the power supply 94–106 and terminal 108. The contact 110 is movable between a PHASE ANGLE contact 112, a STAND-BY contact 114 and a REPETITION RATE contact 116. Closing the movable contact 110 on the PHASE ANGLE contact 112 energizes a plurality of bilateral switch controls 118a, 118b, 118c, and 118d which are similarly identified in FIG. 3. Likewise, closing the movable contact 110 on the REPETITION RATE contact 116 energizes a plurality of bilateral switch controls 120a, 120b, 120c, and 120d which are similarly identified in FIG. 3. The high-valued resistors 121 connecting each of contacts 112 and 116 to ground permit the controls 118 and 120, upon initial energization and subsequent deenergization, to reestablish themselves at ground reference.

3(a) Phase Angle Circuitry

The +12 volts at terminal 108 is also applied through line 122 to the power input terminal 7 of an operational amplifier 124 (MC1741) which serves as a frequency reference for the PHASE ANGLE mode of operation.

A center tap 126 is provided on the secondary 96 of transformer 94 and provides a signal ground reference through line 128 to signal input 3 of the operational amplifier 124. A line frequency AC signal from one end 130 of the secondary of the transformer 94 is applied through line 132 to signal input 2 of the operational amplifier. The amplifier power from terminal 4 is grounded through lead 134.

The output of the amplifier 124 from terminal 6 is a square wave going to a logic "1" level upon a positive-going zero crossing of the line voltage and going to a logic "0" level upon a negative-going zero crossing. The capacitor 136 across lines 128 and 132 provides noise suppression from the power line. The capacitor 138 between line 132 and the output terminal of the amplifier 140 provides high frequency noise suppression in the output to insure a clean square wave output and the elimination of false triggering.

The resistors 144 and 146 provide a +6 volt D.C. bias to signal input terminal 3. The resistor 142 in line 128 connects the signal input terminal 3 to the center tap 126 of the transformer secondary 96 and increases the impedance of the source to amplifier 124.

Resistor 148 in line 132 serves to balance the impedance to ground on signal input terminal 2 with that of input terminal 3. The result is to produce at the output terminal 6 a square wave which is exactly in phase with the zero crossing point of the input A.C. signal.

The output of the amplifier 124 is applied through lead 150 and bilateral switch 152 to a combined comparator and voltage controlled oscillator 154 (CD4046) (hereafter, VCO), which together with a low pass filter comprise a phase locked loop. The synchronism is developed through three decade counters 151, 153, and 155 (CD4017) the controls of which appear on the face of the cabinet 10, with associated circuitry.

The bilateral switch control 118a is energized by the mode switch so closing the circuit through the bilateral switch 152. The square wave line frequency reference is fed through conductor 156 to the reference signal input terminal 14 of the comparator. Operating power for the VCO is provided at terminal 16 from power output point 108 (108b). The power circuit is grounded from terminal 5.

The input of the line frequency square wave causes the VCO output, which is modified by feedback from the loop, to oscillate between logic level one and logic level zero at a rate of 360 Hz per input pulse. The output pulses are fed from terminal 4 of the VCO through line 160, terminal 162 and line 164 to an input of counter 151. Unit oscillations are counted by counter 151 to 9 whereupon counter 151 resets to 0 and transmits a pulse through line 166 to the tens counter 153. The tens and units counters normally would then count pulses to 99, reset and transmit a pulse through line 168 to the hundreds counter 155.

A pair of parallel NAND gates 170, 172 are connected to digit outputs of the counters 151, 153, and 155. Both gates are connected to "0" terminal of the units counter 151 by conductor 174. Gate 170 is connected to the "6" terminal of the tens counter and the "3" terminal of the hundreds counter by conductors 176 and 178 respectively. Gate 172 is connected to the "2" terminal of the tens counter and the "7" terminal of the hundreds counter by conductors 180 and 182 respectively. The output of gate 170 is connected to terminal 184. The output of gate 172 is connected to terminal 186. Both terminals 184 and 186 are connected to the input of a two input NAND 188, the output of which is connected by conductor 190 through closed (118b) bilateral switch 192, terminal 194 and terminal 196 to the comparator feedback input terminal 3 of the VCO 154.

The counters will count pulses delivered by the VCO to three hundred sixty when a pulse will be delivered back through line 190 to the comparator feedback input, and if the phase angle of the desired output transient is less than 360°, the counters will reset, and the count started over again. In the event that the output transient is at an angle greater than 360°, there will be no resetting at the end of 360 pulses, and the count will continue to 720 pulses. At this point, a pulse will be delivered through gate 172 and 188 to the comparator feedback input and, necessarily this time, the counters will be reset. Gate 172 is provided since there is no necessary resetting after the pulse is transmitted through gate 170.

If the pulse input to the comparator of the VCO lags the next wave front of the positive going square wave derived from the operational amplifier 124, the operation of the combined comparator and VCO is to accelerate the pulses delivered to the counter system. If the comparator feedback pulse precedes the leading edge of the next positive going pulse from the operational amplifier, the comparator and VCO operate to retard the production of pulses to the counter system. Thus the VCO operates to lock in on an exact three hundred sixty pulses delivered to the counter system with each cycle of the line current.

The operation of the VCO in establishing the three hundred sixty pulses to the counter system is dependent upon the discrimination of the difference between the time of the leading edge of the positive going wave front from the operational amplifier and the pulse received back from the counter system. The comparison or the combination of the two signals produces relatively high frequency "sum" effects as well as the low frequency "difference" signal. To insure that the VCO responds only to the "difference", the combined signals are fed to terminal 13 of the VCO and through a low pass filter. The filter is comprised of the resistor 198 leading to terminal 200 and from terminal 200 through a line 202 containing capacitor 204 and resistor 206 to ground. Line 208 runs from terminal 200 to terminal 9 of the VCO in parallel with the filter. The filter thus grounds out the relatively high frequency "sum" components, and the low frequency "difference" signal, 70 Hz and below, is returned to the VCO for varying the rate of oscillation.

In the STAND-BY mode to be later described, the VCO is apt to be unstable and lead to the production of unwanted pulses. To correct this, the +12 volt bias is applied to the comparator input from 108c through terminal 196 to bring the VCO to logic 1 condition for stability. Likewise, any charge on the reference frequency input terminal 14 is leaked to ground through resistor 209.

The various digit outputs of the counters 151, 153, and 155 are brought out to individual stationary contacts 210 which are individually engageable by the sliding contacts 16, 18, and 20 carried by the similarly identified thumb wheels on the front panel of the housing 10. The output of the sliding contacts 16, 18, and 20 are conducted through leads 212, 214, and 216 to a three input NAND gate 218. Each of these leads is grounded through resistors 220 to provide ground reference as the sliding contacts move between stationary contacts. The output of gate 218 goes to terminal 222 and from terminal 222 to the input of R-S flip-flop 224. From the output 226 of flip-flop 224, a line 228 extends to terminal 230 and from terminal 230 through line 232 and closed (118c) bilateral switch 234 to line 236 leading to the output circuitry.

Terminal 222 is also connected to R-S flip-flop 238 which forms a part of the counter reset circuitry. The output of the flip-flop 238 is connected to one of the inputs of a two input NAND gate 240 through line 242. The other input of the gate 240 is connected through an inverter 244 to terminal 184 by lead 246. The output of gate 240 is applied to one of the inputs of the three input gate 248 of flip-flop 250. The output of flip-flop 250 is connected through line 252, closed (118d) bilateral switch 254 and line 256 to the reset inputs 258 of the counters 151, 153, and 155.

The second external input of gate 248 is connected by line 249 to terminal 186.

The reset circuitry operates as follows. Assuming the phase angle is set to less than 360°, 200° for instance, a pulse will be delivered at the two hundred count through gate 218 to terminal 222 to flip-flop 238 which reverses state to condition gate 240 for but not produce a pulse output. The counter then continues to run to 360° at which point a pulse is delivered through gate 170, terminal 184, line 246, inverter 244 and conditioned gate 240 to produce the pulse to cause flip-flop 250 to change state. This change of state is transmitted through line 252 to cause a counter reset. At the same time, flip-flop 238 is reset from terminal 254 of flip-flop 250 and line 257.

Flip-flops 224 and 250 are reset continuously from terminal 162 in line 164 through line 258, terminal 260, and line 262 to flip-flop 224 and from terminal 260 through line 264 to flip-flop 250. The actual resetting pulse is repeated at the frequency of the phase locked loop.

Where the phase angle is established to fall between 360° and 720°, the operation differs in that flip-flop 238 is not triggered prior to the production of the 360° pulse and so gate 240 is not conditioned for pulse transmittal. After the transient pulse occurs, the next event is a pulse on the 720° reset line 249 connected to the output 186 of gate 172 and to input 268 of gate 248 of flip-flop 250. The counter reset is then initiated through line 252 and the flip-flops reset as before.

The counter reset line 256 is provided with a source 108h of +12 volts through resistor 270 to reset the counters upon turning the mode switch to the STANDBY position.

3(b) Repetition Rate Mode

When the mode switch is in the REPETITION RATE position, bilateral switch controls 120a, b, c, and d are energized to close their respective switches and bilateral switch controls 118a, b, c, and d are deenergized to open their associated switches.

A timer 272 (NE555) is provided to generate a 100 Hz reference pulse rate for the phase locked loop. The adjustable resistor 274 associated therewith is for the initial adjustment of the timer to establish it precisely at 100 Hz. The remaining circuitry shown in association therewith is that specified by the manufacturer for operation of the timer.

The output of the timer is fed through line 276 through now closed bilateral switch 278 to terminal 280 in line 156. Thus the timer substitutes itself for the line frequency reference in the phase angle mode of operation. The output of the VCO again is fed to the counters 151, 153, and 155 through line 164.

By virtue of opening the bilateral switch 192 in line 190 due to the deenergization of control 118b and the closing of bilateral switch 282 connected by line 283 between output terminal 226 of flip-flop 224 and terminal 194 leading to the comparator feedback input 3 of the VCO, the oscillation rate of the VCO is no longer established by the 360 pulses per cycle of line voltage but rather is established by the indicated frequency of the sliding contacts per cycle of the timer 272 output. Thus, as before, the indicated cycle of pulses is determined when the count arrives at the figures indicated by the movable switch contacts 16, 18, and 20, at which point a pulse is delivered through gate 218 to terminal 222. From this terminal, the state of flip-flop 224 is reversed to deliver a pulse to terminal 226, line 283, bilateral switch 282, terminal 194, terminal 196 and to the comparator feedback input 3 of the VCO. The phase locked loop thereupon ajusts the frequency established by the sliding contacts 16, 18, and 20 of the counter switch per output pulse of the timer 272.

The phase locked loop is tapped from terminal 162 in the VCO ouput line 160 through line 258, terminal 260 and line 262 to deliver pulses to two consecutive decade counters (CD4017) 286 and 288, identical with decade counters 151, 153, and 155, to divide the pulse output of the phase locked loop by 100. The output of the counters is delivered by now closed bilateral switch 290 to the output circuitry through line 236.

The counters reset in the same fashion as described in conjunction with the PHASE ANGLE mode of operation; terminal 226 which delivers the counted output pulse of the counters to the comparator feedback input of the VCO is also connected to the counter reset line 256 through line 228, terminal 230, line 287, and mode-switch-controlled bilateral switch 289.

The capacitor 292 connected between terminals 6 and 7 of the VCO and the fixed resistor 294 and variable resistor 296 connected between terminal 11 of the VCO and ground adjust the maximum frequency rate of the VCO, which is established at 1,000 cycles per input pulse. This will be achieved by setting the movable contacts 16, 18, and 20 each at zero.

The purpose underlying the multiplication of the desired repetition rate frequency by 100 with the timer 272 and thereafter dividing by 100 with the consecutive digital counters 286 and 288 is to permit the use of the low pass filter 198, 204, 206 with the REPETITION RATE mode as well as the PHASE ANGLE MODE OF OPERATION.

3(c) Stand-By Mode and Strobe Output Circuit

Line 236 is connected to terminal 299 of the input gate 300 of flip-flop 302 to produce a square wave pulse output in line 304 with each pulse delivered through line 236 whether in the PHASE ANGLE mode or REPETITION RATE mode. Line 236 includes a connection to the +12 volt power supply 108d to impose a normal +1 logic condition on the flip-flop 302 and keep it from floating. Line 304 is connected to one side of capacitor 308, the other side of which is connected to the base of pnp transistor 306. The emitter of transistor 306 is connected to line 312 which is at +12 volts by virtue of its connection 108e to the power supply 94-106. A diode 310 is connected between line 312 and the base of the transistor 306 to prevent exceeding the rated base-emitter breakdown of the transistor. The effect of the capacitor 308 is to convert the square wave output of the flip-flop into a spike and trigger a pulse in transistor 306 on the leading edge of the flip-flop output pulse.

The collector of transistor 306 is connected to terminal 314 and thence to ground through resistor 316. Terminal 314 is connected to the jack 24 on the face of the cabinet through capacitor 318. Terminal 314 is also connected to the base of npn transistor 320. The emitter of transistor 320 is connected through resistor 322 to ground. The collector of the transistor is connected through terminal 324 and resistor 326 to line 312.

Terminal 324 is connected to the input terminal 2 of a one shot multi-vibrator (NE555) 328. Terminal 6 and 7 of the multi-vibrator 328 are connected to line 312 through a resistor 330 and to ground through a capacitor 332. The output 334 of the multi-vibrator connects to the high voltage circuit to establish pulse generation therein.

The section including transistor 306, transistor 320, and the multi-vibrator 328 serve to deliver a pulse of precise duration to the high voltage printed circuit board. The time constant of the pulse is determined by resistor 330 and capacitor 332. The sharply peaked pulse as differentiated by the capacitor 308 appears as an amplified positive spike at terminal 314 which, controlling transistor 30, establishes a negative spike at terminal 324 which is applied to the multi-vibrator.

A cable plugged into the pulse in/out jack 24 will derive a pulse from terminal 314 for delivery to external instrumentation should that be desired. Resistor 316 limits the current flow through transistor 306 and establishes an impedance match with the cable to be attached to jack 24 for effecient pulse output. Resistor 326 is a current limiting resistor for the transistor 320 and resistor 322 establishes the necessary bias on the transistor 320.

It will be recalled that jack 24 can be used for inputting pulses as well as outputting them. Apparatus providing positive pulses will be plugged into the jack 24. The mode switch will be moved to STAND-BY position, in which circumstance no pulses are emitted from the flip-flop 302. The input pulses are applied to the base of transistor 320, generating negative pulses at terminal 324 which are applied to the multi-vibrator 328 for pulse shaping.

When the device is in STAND-BY condition, the single pulse switch 22 which appears on the face of the cabinet may be used to generate single pulses in the apparatus manually. The switch is shown in its normal unactivated condition closed on contact 336. Pushing the switch button in causes the movable contact 22 to close on contact 338 and release of the button causes the movable contact to revert to contact 336. In the STAND-BY mode, of course, no pulses appear on line 236.

Closing switch 22 on contact 338 imposes a 0 logic position on gate 300 of flip-flop 302 due to the grounding of the power input from terminal 108e through resistor 340. Terminal 336 is connected to the other side input of the flip-flop 302 by line 342 which is connected to energized terminal 108f by resistor 344. Moving the switch 22 to terminal 338 changes the logic condition in line 346 from 1 to 1, but the base of transistor 306 is not biased on since capacitor 308 is discharging. Flip-flop 302 is now conditioned for the application of a pulse to transistor 306. Upon the release of switch 22 which moves the movable contact from 338 to 336, the flip-flop reverses, and the leading edge of the reversal is transmuted by capacitor 308 into a pulse on the base of the transistor 306. The pulse is then again modified as described above by the multi-vibrator 328 for output.

It will be noted that when the single pulse switch is moved to contact 338 by pushing in the button and the mode switch is either in the PHASE ANGLE or REPETITION RATE modes, the input 346 of gate 300 of flip-flop 302 is reduced to a 0 logic level, and the gate will not be affected by logic level changes or pulses entering through line 236 to the other input 299 of gate 300. Thus holding the single pulse button in, or closed on contact 338 inhibits the output of pulses in the two automatic modes.

The output of multi-vibrator 328 is fed through line 334 to a current-limiting resistor 348 and consecutively to the LED portions 350 and 352 of the optical isolators to be later described, and to ground.

The operation of the control logic circuitry is summarized in the block diagrams of FIGS. 6 and 7, illustrating, respectively, the circuitry in the PHASE ANGLE mode and in the REPETITION RATE mode.

4. High Voltage Circuit

Figure 4:
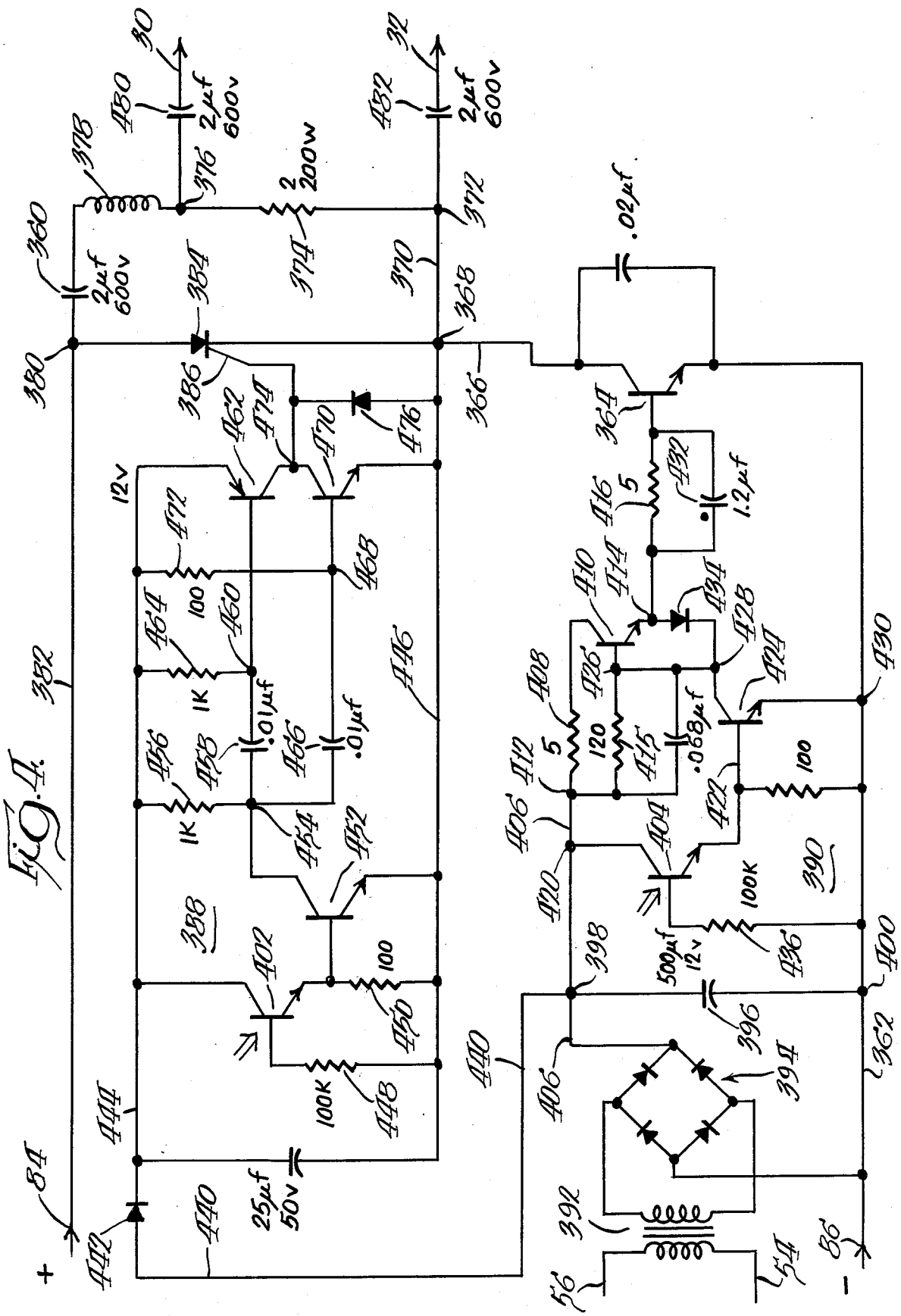
FIG. 4 is a diagram of the high voltage circuitry.

The high voltage circuit (FIG. 4) connects to the like identified positive terminal 84 and negative terminal 86 of the high voltge power supply described above (FIG. 2).

The charge path for the discharge capacitor 360, starting from the negative terminal 86, is through line 362, the switching transistor 364, line 366, terminal 368, line 370, terminal 372, resistor 374, terminal 376, inductor 378, discharge capacitor 360, terminal 380, and line 382 to the positive terminal 84 of the high voltage power supply. A discharge SCR 384 controlled by a gate 386 is located between terminals 368 and 380 and provides for the discharge path of the discharge capacitor 360, the discharge occurring through SCR 384, terminal 368, line 370, terminal 372, resistor 374, terminal 376, and inductor 378. High voltage circuitry indicated generally by 388 is provided for switching the SCR 384 on, and low voltage circuitry indicated generally at 390 is provided for switching the charging transistor 364 on or off.

The low voltage circuit 390 derives line voltage from terminals 54 and 56 of the high voltage power supply (FIG. 2). The voltage is reduced by transformer 392, rectified by full wave rectifier 394 and filtered by capacitor 396 to establish a +12 volt potential at terminal 398 in reference to circuit ground terminal 400.

The phototransistor 402 of optical isolator 350 is in the high voltage circuit 388 and triggers the energization of the gate 386 of SCR 384 to initiate discharge. The phototransistor 404 of optical isolator 352 is located in the low voltage circuit 390 and cuts off the switching transistor 364 as the SCR is turned on for discharge.

In charging, the base of the switching transistor 364 is forwardly biased from terminal 398 through line 406, resistor 408, conductive transistor 410, terminal 414, and resistor 416. Transistor 410 is biased for conduction through terminal 412 in line 406 and resistor 415 connected to the base of transistor 410.

When the optical isolator is turned on, the transistor 404 becomes conductive. Positive current from line 406 flows from terminal 420 through the transistor to line 422 to the base of transistor 424, turning it on. Transistor 424 thus becomes a conductive path from terminal 426 between resistor 415 and the base of transistor 410 and terminal 428 to the ground potential line 362 at terminal 430. This has the effect of shorting out the bias on the base of transistor 410 which thus becomes nonconductive and no longer forwardly biases the switching transistor 364 which likewise becomes nonconductive.

It is of importance that the circuit controlling the switching transistor 364 operate as instantaneously as possible to track exactly the turning on and turning off of the phototransistor 404. To this end, capacitor 432 is provided in parallel with resistor 416 between the terminal 414 and the base of the switching transistor 364 which provides a momentary reverse bias on the transistor 364 when transistor 410 is cut off. The charge on the capacitor can then drain through to ground by means of diode 434 connected between terminals 414 and 428, and thence through transistor 424 to terminal 430.

Likewise, resistor 436 is connected to the base of the phototransistor 404 and ground line 362 to discharge capacitative charges between the emitter and the collector developed in that transistor when it is on. Without this resistor, the phototransistor would remain conductive for a brief period after its associated LED turns off.

Power for the SCR circuit 388 is derived from terminal 398 through lead 440 and isolation diode 442 leading to line 444 having the same +12 volt potential in reference to line 446 (and line 362 through the switching transistor 364, line 366, and terminal 368) as the low voltage circuit 390 when the discharge capacitor 360 is being charged. During discharge, when the switching transistor 364 is shut off, circuit 388 is referenced to the high voltage line 382, and the isolation diode 442 is provided to block reverse discharge voltages to the previously described circuitry and avoid damage.

The phototransistor of optical isolator 402 is connected across lines 444 and 446 with resistor 448 extending from the base of the transistor 402 to line 446 and resistor 450 extending from the emitter of the transistor 402 to line 446. The emitter of transistor 402 is connected to the base of transistor 452. The emitter of that transistor is connected to line 446; the collector is connected to terminal 454 and through resistor 456 to line 444. When the discharge capacitor 360 is being charged, the phototransistor 402 is deenergized and by virtue of its being in a nonconductive state, transistor 452 is likewise nonconductive.

Terminal 454 is connected through capacitor 458 and terminal 460 to the base of pnp transistor 462. A 1K resistor 464 is connected between terminal 460 and line 444. Terminal 454 is also connected through a capacitor 466 and terminal 468 to the base of npn transistor 470. A 100 ohm resistor 472 is connected between terminal 468 and line 444. The emitter of transistor 462 is connected to line 444 and the collector is connected to terminal 474. The collector of transistor 470 is also connected to terminal 474. The emitter thereof is connected to line 446. Terminal 474 is connected to the gate 386 of the SCR 384. Diode 476 is connected between the terminal 474 and line 446.

When the discharge capacitor 360 is charging and the phototransistor 402 is off, transistor 470 is biased for conductivity from the gate 386 of the SCR to line 446. The voltage drop is on the order of 0.2 volts which is insufficient to trigger the SCR but prevents false triggering attributable to radiation-induced noise developed in the gate 386, shorting such noise out to line 446. Transistor 462 is off.

When the optical isolator 402 is energized, the light sensitive transistor conducts, so making transistor 452 conductive. Voltage at terminal 454 abruptly drops, producing a pulse across capacitors 458 and 466. Capacitor 458 in combination with resistor 464 constitutes a differentiating circuit which delivers a peaked pulse with an exponential decay of from 2 to 6 microseconds to the base of transistor 462, so turning that transistor on. At the same time, a similar pulse of less duration is derived from the differentiating circuit consisting of capacitor 466 and resistor 472 to reverse bias the base of transistor 470 to turn that transistor off for a measurable period of time but less than the period of time transistor 462 is on.

The output of transistor 462, when on, is on the order of 12 volts, well in excess of the 1.2 volts necessary to trigger the SCR 384. The time interval during which transistor 462 is on is necessary for a full triggering of the SCR. The SCR requires a minimum of about 1 microsecond to turn fully conductive. The values assigned to the differentiating circuit, capacitor 458 and resistor 464 keep the pulse width sufficiently long for a full gating of the SCR under all circumstances.

The smaller time constant of the differentiating circuit of transistor 470 ensures that transistor 470 will turn on before transistor 462 turns off. This turn-on has the effect of dropping the potential on the gate of the SCR to provide a limit to the pulse applied by transistor 462.

When the SCR is triggered, the capacitor 360 discharges, as described before, through inductor 378, terminal 376, resistor 374, terminal 372, terminal 368, SCR 384, and terminal 380. The inductor 378 is a low turn inductor on an easily saturating core. It coincides in function with the slow turn-on of the SCR and delays the initiation of current until the SCR is fully on. After the initial delay, the core saturates and the inductor 378 disappears as a circuit element for all practical pusposes.

The resistor 374 constitutes the source impedance and provides the voltage drop between the output terminals 372 and 376. It will be appreciated that varying the value of the resistor permits an adjustment of resistive source impedance.

The diode 476 prevents voltage kickbacks through the gate of the SCR to the controlling part of the circuit during capacitor discharge.

Resistor 448 associated with the phototransistor 402 again provides for immediate turn off of the transistor by discharging capacitance that may have developed between the emitter and collector thereof.

The output terminals 376 and 372 are connected to the external terminals 30 and 32 appearing on the face of the cabinet through capacitors 480 and 482 respectively. These capacitors isolate the transient generator from any currents which may be prevailing in the apparatus to which the pulse is to be delivered.

It will be noted that while the digital circuitry (FIG. 3) is ground-referenced, the charging-discharging circuitry (FIG. 4) is ground-isolated, including a physical and electrical isolation from the digital circuitry by virtue of the optical couplers. Thus the discharge terminals 30 (negative) and 32 (positive) can be connected to apparatus to be tested, optionally to deliver a positive or negative transient thereto.

Reference was made earlier to the importance of the multivibrator 328 in the control logic circuit which dictates the duration of the strobe, rather than simply using the output of the transistor 320 for strobe generation. It will be appreciated that the charging transistor 364 is turned off for the duration of the strobe. The SCR is gated "on" by the leading edge of the strobe pulse, although as has been explained above, turn-on of the SCR and discharge of the capacitor 360 require measurable time. The multivibrator assures a determinable "off" period for the charging circuit to accommodate all variables in the discharge time and turn-off time of the SCR 384. At the same time, subject to this limitation, it permits establishing the "off" time at a minimum to permit full charging of the discharge capacitor for high voltage, high repetition rate transients.

For clarity in the specification above and the claims it will be understood that a "differentiator" or "differentiating" circuit has the characteristic of converting a square wave into a sharp pulse with usually an exponential decay, and the process of "differentiating", therefore, means such conversion. A "strobe" is a light flash or light pulse such as might be derived from energization of a light-emitting diode.

An embodiment only has been described here. Variations and optional expedients in the circuitry will undoubtedly suggest themselves. This invention, therefore, should be regarded as being limited only as set forth in the following claims.

I claim:

1. A transient generator comprising a series discharge circuit includng a discharge capacitor, a pair of output terminals, a resistor between said output terminals, and the anode and cathode of a silicon controlled rectifier; DC circuit means connected across said capacitor for charging said capacitor; circuit means for gating said silicon controlled rectifier for conduction; and means for interrupting said DC circuit means during discharge of said capacitor; said discharge circuit being characterized by a virtual absence of inductive impedance during discharge.

2. The combination as set forth in claim 1 wherein said discharge circuit includes additionally a low value inductor to delay the onset of capacitor discharge during turn-on of said silicon controlled rectifier which saturates substantially below capacitor discharge current flow.

3. A transient generator comprising a series discharge circuit including a discharge capacitor, output terminals, and the anode and cathode of a silicon controlled rectifier; a high voltage DC charging circuit connected across said capacitor and having a switching transistor therein, circuit means for determinng the production of a transient and having an output signal to initiate said transient, and coupler means responsive to said signal to make said transistor nonconductive and to trigger said silicon controlled rectifier for capacitor discharge through said discharge circuit upon the occurrence of said signal.

4. The combination as set forth in claim 3 wherein said output signal is a strobe and said coupler means is optical.

5. The combination as set forth in claim 3 wherein said discharge and charging circuits are ground-isolated.

6. The combination as set forth in claim 4 wherein said discharge and charging circuits are ground-isolated.

7. The combination as set forth in claim 4 wherein said optical coupler means comprises a first optical coupler responsive to said strobe connected to make said transistor nonconductive during said strobe and a second optical coupler means connected to trigger said silicon controlled rectifier upon the initiation of said strobe.

8. The combination as set forth in claim 7 wherein said discharge and said charging circuits are ground-isolated.

9. The combination as set forth in claim 7 wherein said strobe has a predetermined duration and said second coupler means includes differentiating means to limit the duration of triggering of said silicon controlled rectifier to a shorter duration than said strobe.

10. The combination as set forth in claim 9 wherein said second coupler means includes second differentiating means to limit the duration of said first differentiating means.

11. In electrical apparatus, means for producing a signal at any one of a number of equally spaced phase angles in a cycle in reference to an input alternating current, which comprises means for converting said alternating current into a logic level change upon each crossing of the zero voltage axis, a comparator and a voltage controlled oscillator controlled by the output of said comparator defining a phase locked loop, circuit means for delivering the output of said converting means to the reference input terminal of said comparator, said oscillator having a multi pulse output per logic level cycle, pulse counting means for counting the output cycles of said oscillator, circuit means connected to said counting means to return a synchronizing pulse to the feedback input terminal of said comparator at the conclusion of a count to said number of phase angles to synchronize said synchronizing pulse with said logic level cycle and to reset said counting means, and means for deriving and producing a signal from said counting means at any predetermined count within said cycle.

12. The combination as set forth in claim 11 wherein the output of said voltage controlled oscillator and said signal counting means are pulses.

13. In electrical apparatus, means for producing a signal at any selected phase angle from 0° to a multiple of 360° in reference to an input alternating current which comprises means for converting said alternating current into a logic level change upon each crossing of the zero voltage axis, a comparator and a voltage controlled oscillator controlled by the output of said comparator defining a phase locked loop, circuit means for delivering the output of said converting means to the reference input terminal of said comparator, said oscillator having a multipulse output per logic level cycle, sufficient serially arranged decade counters to count to said multiple receiving the output pulses of said oscillator connected to deliver synchronizing pulses to the feedback input terminal of said comparator at 360 pulses and multiples thereof to synchronize said synchronizing pulses with said logic level cycle and to reset said counters, means for deriving and producing an output signal from said counters at any predetermined count up to said multiple, and gating means connected to receive said signal and to inhibit the application of said synchronizing pulses only to the counter resets until an output signal has been first produced.

14. The combination as set forth in claim 13 wherein said phase angle output signal is from 0° to 720°, said serially arranged decade counters develop synchronizing pulses for the feedback terminal of said comparator at 360 and 720 pulse counts and to reset said counters, and said gating means is connected to receive said signal and to inhibit the application of the 360 count pulse to the counter resets when an output signal has not been first received.

15. A transient generator for producing a series of transients at any desired repetition rate within a range, comprising a series discharge circuit which includes a capacitor, a pair of output terminals, and the anode and cathode of a silicon controlled rectifier; DC circuit means for charging said capacitor, means for supplying triggering pulses to said silicon controlled rectifier at said rate, and means for interrupting said charging circuit during capacitor discharge and thereafter restoring said circuit, said pulse supplying means including a phase locked loop having a reference input terminal, a feedback input terminal, and a pulse output, a reference frequency source for supplying a reference frequency to the reference input terminal of said phase locked loop, pulse counting means connected to the output of said phase locked loop adjustable to any count within the range of said counting means, circuit means for delivering a synchronizing pulse from said counting means to the feedback input terminal of said phase locked loop and for resetting said counting means upon the arrival at said count, and circuit means connected to the output of said phase locked loop for delivering the pulses thereof to the gate of said silicon controlled rectifier.

16. The combination as set forth in claim 14 wherein said pulse delivering circuit includes a counter to divide the frequency of said signal by the digital value of said counter to shift the range of said repetition rate.

17. In electrical apparatus, means for optionally producing a signal at any one of a number of equally spaced phase angles in reference to an input reference frequency or producing said signal at any desired repetition rate within a range comprising a reference frequency source, a comparator having a reference input terminal connected to said reference frequency source and a feedback input terminal, a voltage controlled oscillator connected to be controlled by said comparator having an output terminal, pulse counting means connected to count the output pulses of said oscillator, said counting means including means adjustable to any count within the range of said counting means, circuit means including a first switch connecting said counting means and said feedback terminal to deliver a pulse to said terminal at the conclusion of a count to said number of phase angles to control said voltage controlled oscillator to synchronize said pulse with said reference frequency and to reset said counting means, circuit means connected between said adjustable means to obtain a pulse therefrom at an adjusted count and a signal output terminal, circuit means including a second switch connected between said voltage controlled oscillator output terminal and said signal output terminal, and circuit means including a third switch connected between said adjustable means and said feedback input terminal.

18. The combination as set forth in claim 17 wherein said reference frequency source comprises line alternating current.

19. The combination as set forth in claim 17 wherein said line alternating current is employed as the reference frequency source for said phase angle mode of operation and including additionally a second reference source for said repetition rate mode of operation, and circuitry including switch means for optionally connecting either of said reference frequency sources to said reference frequency input terminal of said comparator.

* * * * *

UNITED STATES PATENT OFFICE
CERTIFICATE OF CORRECTION

PATENT NO. : 4,071,780

DATED : January 31, 1978

INVENTOR(S) : Ronald H. Burnett

It is certified that error appears in the above-identified patent and that said Letters Patent are hereby corrected as shown below:

Col. 5, line 50 before "pulse" insert --feedback--

Col. 5, line 59 before "VCO" insert --comparator and--; "operates" should read -- operate--.

Col. 8, line 60 "30" should be --320--

Col. 9, line 29 "1", second occurrence, should read -- 0 --.

Signed and Sealed this

Sixteenth Day of May 1978

[SEAL]

Attest:

RUTH C. MASON
Attesting Officer

LUTRELLE F. PARKER
Acting Commissioner of Patents and Trademarks